United States Patent [19]
Seyyedy

[11] Patent Number: 5,969,380
[45] Date of Patent: *Oct. 19, 1999

[54] THREE DIMENSIONAL FERROELECTRIC MEMORY

[75] Inventor: Mirmajid Seyyedy, Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/660,112

[22] Filed: Jun. 7, 1996

[51] Int. Cl.⁶ .................................................. H01L 29/76
[52] U.S. Cl. ............................ 257/295; 365/65; 365/145
[58] Field of Search .................................. 257/295, 202, 257/207; 365/65, 100, 102, 145

[56] References Cited

U.S. PATENT DOCUMENTS

| | | | |
|---|---|---|---|
| 3,611,321 | 10/1971 | Baer | 340/173 SP |
| 4,860,254 | 8/1989 | Pott et al. | 365/147 |
| 4,926,051 | 5/1990 | Turnbull | 250/332 |
| 5,081,559 | 1/1992 | Fazan et al. | 361/313 |
| 5,164,808 | 11/1992 | Evans et al. | 361/305 |
| 5,198,384 | 3/1993 | Dennison | 437/47 |
| 5,214,300 | 5/1993 | Rohrer et al. | 257/295 |
| 5,375,085 | 12/1994 | Gnade et al. | 365/145 |
| 5,376,817 | 12/1994 | Seyyedy et al. | 257/374 |
| 5,424,975 | 6/1995 | Lowrey | 365/145 |
| 5,541,872 | 7/1996 | Lowrey et al. | 365/145 |

Primary Examiner—Donald L. Monin, Jr.
Assistant Examiner—Douglas A. Wille
Attorney, Agent, or Firm—Schwegman, Lundberg, Woessner & Kluth, P.A.

[57] ABSTRACT

A three dimensional ferroelectric memory device formed on a semiconductor substrate has insulative material formed between rows of conductors to reduce cross talk between the conductors. Access circuitry or other circuitry is formed beneath the three dimensional structure. Continuous conductors, or staggered vias provide for connection to conductors forming the memory cells. An access circuit is provided which eliminates the need for an access transistor for each memory cell by using a memory cell with a reference cell in combination with sensing circuitry. Read cycles are followed by write cycles and an equilibrate cycle to reverse the effects of destructive reads on the memory cells. Side by side memory structures provide the ability to access using either a folded or open bit line circuit.

30 Claims, 7 Drawing Sheets

THREE DIMENSIONAL FERROELECTRIC MEMORY

This invention was made with government support under Contract No. MDA972-94-C-0006 awarded by Advanced Research Projects Agency (ARPA). The Government has certain rights in this invention.

FIELD OF THE INVENTION

The present invention relates to a ferroelectric memory devices, and in particular to a three dimensional ferroelectric semiconductor memory device and circuit for accessing the device.

BACKGROUND OF THE INVENTION

Random access memory devices for storing digital data have usually taken the form of integrated circuit devices having thousands of memory cells. The memory cells in the past have been formed with capacitors to hold an electrical charge representative of a bit of data, and numerous transistor and diode structures associated with each cell to access the data. The ability to provide more memory cells in a given area has been directly related to the ability to form smaller and smaller structures using photolithography and other common processes and to improvements in reducing the amount of access circuitry associated with each cell. X-ray lithography promises smaller structures, but is far from becoming practical. Another option is to stack layers of memory cells on top of one another. A problem with stacking arises from the use of high temperatures to form the subsequent layers. The high temperatures cause the previous layers to continue to change. Dopants used in the formation of the previous layers continue to diffuse under such high temperatures, making it very difficult to keep the memory cells in earlier formed layers from becoming defective.

Figure 1:
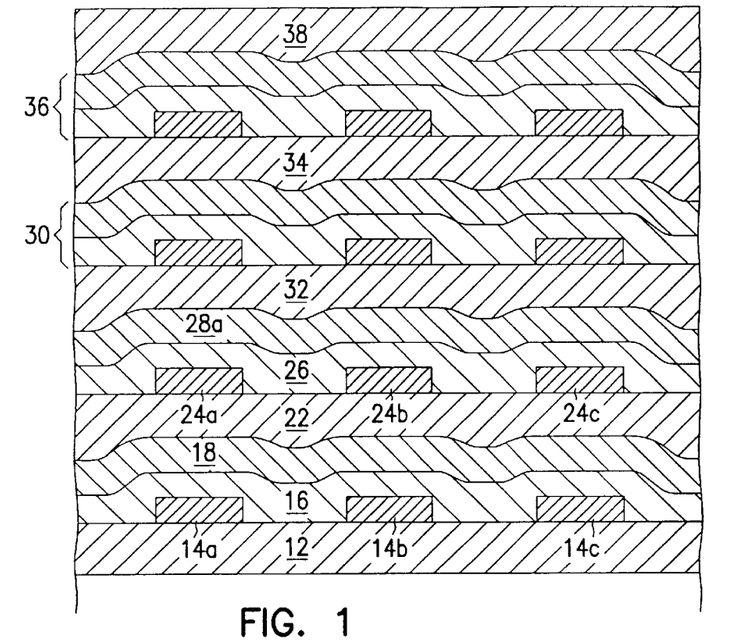
FIG. 1 is a cross section representation of a prior art three-dimensional ferroelectric integrated memory device.

One solution to this problem is seen in U.S. Pat. No. 5,375,085 to Gnade et al. Rather than using the standard transistors and capacitive electrical charge to represent digital data, Gnade et al. uses the magnetization of ferroelectric material in a three dimensional semiconductor structure. As seen in prior art FIG. 1, which corresponds to FIG. 4 in the Gnade et al. patent, a first set of parallel conductors 14a, 14b, 14c, are arranged perpendicularly to a second set of parallel conductors indicated at 18 over a semiconductor substrate 12. A layer of ferroelectric material 16 is deposited between the sets of conductors. When an electrical voltage is applied to a conductor in each layer, the ferroelectric material between the overlap of the conductors forms a capacitor which retains an electrical polarization whose orientation is representative of a bit of data. The orientation of the polarization affects the value of the capacitance between the conductors. Data stored in a cell can be determined by applying an electric voltage, and detecting the difference in capacitance caused by different polarization orientations of the cell. Multiple layers of conductors and ferroelectric material are formed without adversely affecting previous layers, providing a three dimensional storage device.

A problem with the three dimensional storage device described above is that the ferroelectric material is deposited between the lower set of conductors, resulting in significant capacitive loading between adjacent conductors. If the loading is too great, the polarization of the ferroelectric material may not be sufficient to generate a readable signal, resulting in corruption of data in the storage device. There is a need for providing three dimensional ferroelectric semiconductor memory devices with minimal capacitive loading between adjacent cells to permit the accurate reading and writing of data.

To read data from a cell, prior ferroelectric storage devices associated an access transistor with each cell to couple the cell to its bit line. Some cells contain two ferroelectric capacitors and two access transistors with one functioning as a reference. The ferroelectric capacitors within each memory cell receive complementary input signals such that the ferroelectric capacitors are polarized in opposite states to indicate a 1 or a 0. When the pairs of capacitors for each cell are read, a resulting voltage on the bit lines, which result from applying a pulse on a plate line, is compared using a differential sense amplifier to compare the voltages on the bit lines and thus determine the polarity on the ferroelectric capacitors within the cell. Having an access transistor for each cell added considerable volume to the size of each cell, reducing the overall cell density obtainable for a ferroelectric storage device. There is a need for a simple access circuit that can sense the data in a cell, and rewrite the data in the same memory access cycle.

While the density of memory cells in three dimensional ferroelectric storage devices is much higher than that of conventional semiconductor memories, the circuitry used to access the memory cells still requires much real estate on the semiconductor substrate. As seen in Gnade et al., the read/write circuitry is positioned adjacent the three dimensional memory cell structure with conductors from the structure being coupled to the adjacent circuitry. There is a need to further increase the overall density of memory cells in storage devices, including the need to reduce the real estate needs of the access circuitry. There is yet a further need to provide electrical contacts to the access circuitry from the three dimensional ferroelectric storage device. In addition, the circuit must be capable of utilizing a reference cell in addition to the data cell without the use of a transistor for each cell.

SUMMARY OF THE INVENTION

A first plane of memory cells for a ferroelectric memory device is formed on a semiconductor substrate by depositing a bottom layer comprising a plurality of substantially parallel conductors on an insulated layer and then providing further insulation between the parallel conductors. The bottom layer is formed to be substantially flat, and a ferroelectric layer is formed on top of it. A top layer of substantially parallel conductors is then formed on top of the ferroelectric layer with insulation formed between the top conductors. The bottom and top layer conductors are used as the plates of a capacitor memory cell, wherein the ferroelectric material where they overlap become electrically polarized by selectively applying electrical energy to the conductors. The orientation of the electrical polarization is representative of a logical 1 or 0.

In one embodiment, the bottom layer of conductors are bit lines for the memory device, and the top layer comprise word or plate lines. The provision of an insulator, such as silicon dioxide, between laterally adjacent conductors in the top and bottom layers of conductors reduces capacitive loading between adjacent conductors reducing the potential for misreading data. Further sets of multi layer memory cells are formed on top of the first set. In one embodiment, three such sets are provided, forming a three dimensional ferroelectric memory device. In further embodiments, many more such layers are formed, having an insulating layer therebetween, providing a very dense memory structure.

The combined conductor and insulator layer in one embodiment are polished flat, such as by a chemical mechanical polish (CMP) or other common means. By ensuring that the conductors are free of oxide, and that the surface of the combined layer is flat, the ferroelectric layer is formed more uniformly, resulting in higher yields and better quality control. In addition, subsequent layers forming further sets of memory cells are much more uniform in structure, since they are continually formed on a flat surface rather than an uneven surface. This also increases yield. In embodiments comprising many more than three sets, or planes of memory cells, the polishing step eliminates deformations which may be propagated and amplified in successive layers. The polishing step allows the formation of multiple plane ferroelectric semiconductor memories with much better yields than previously obtainable.

In a further embodiment, circuitry, such as sensing amplifiers, used to determine the orientation of electrical polarization in a memory cell, and column decoding circuitry used to select individual conductors is formed in the semiconductor substrate beneath or on the periphery of the memory device. This serves to save real estate and increase the cell density of the memory device. To provide contacts between the layers of memory cells, conductive vias or through holes are formed from the conductors down through the planes of cells to the circuity beneath the memory cells. The contacts are formed with suitable non-oxidizing conductive material, such as metal or highly doped polysilicon to provide desired conductive characteristics. The contacts are formed at the ends of the conductive lines, with successive higher layer planes of cells having their contacts formed further out, beyond the contacts of the lower layers. In a further embodiment, the contacts for successive layers are formed on opposite ends, or selectively to optimize path length layout for the entire memory device and circuitry. During formation of the first layer, the conductors are shorter, and vias for the higher layer contacts are formed at the same time as the contact for the instant layer is formed.

In yet a further embodiment, a continuous bit line is formed for each successive layer in a vertical plane. This results in a conservation of space in that the contact for each bit line is in one of two vertical columns as opposed to staggered at the end of each conductor. In addition, it allows an entire vertical plane of memory to be accessed, cutting down on the number of contacts that are required to the underlying circuitry. This embodiment is especially useful where there are a high number of layers of cells.

In still a further embodiment, no insulating layer is provided between layers of memory cells. In this embodiment, each bit line and word line are in direct contact with ferroelectric material on both sides of the lines. This can be useful in sensing the data, where one of the cells provides a reference for the other cell. In a variation of this embodiment, two continuous bit lines are provided for each vertical plane, one for accessing odd numbered horizontal planes of cells, and the other for accessing even numbered horizontal planes of cells.

A read/write circuit for a two cell ferroelectric storage device provides for reading and writing data without an access transistor for each cell. One of the cells serves as a reference for the other cell. The pair of cells are coupled by respective plate and bit lines. The bit lines are coupled through isolation transistors to a pair of sense amps, which are also coupled through a column decode to I/O lines. The bit lines are also coupled to an equilibrate transistor. During a read operation, the plate lines are raised, causing the bit lines to drift and then be forced further apart by the sense amps. The write cycle immediately follows by reversing the voltages of the bit lines and then the plate lines, which rewrites the data in the cells. This is followed by an equilibrate cycle, where the voltages of the bit and plate lines are returned to their pre-read conditions.

BRIEF DESCRIPTION OF THE DRAWINGS

FIG. 5b is a cross section representation of the device of FIG. 5a taken along line 5b–5b in FIG. 5a.

FIG. 5c is a cross section representation of the device of FIG. 5a taken along line 5c–5c in FIG. 5a.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Numbering in the Figures is usually done with the hundreds and thousands digits corresponding to the figure number, with the exception that the same components may appear in multiple figures. Signals and connections may be referred to by the same number or label, and the actual meaning should be clear from the context of use.

Figure 2:
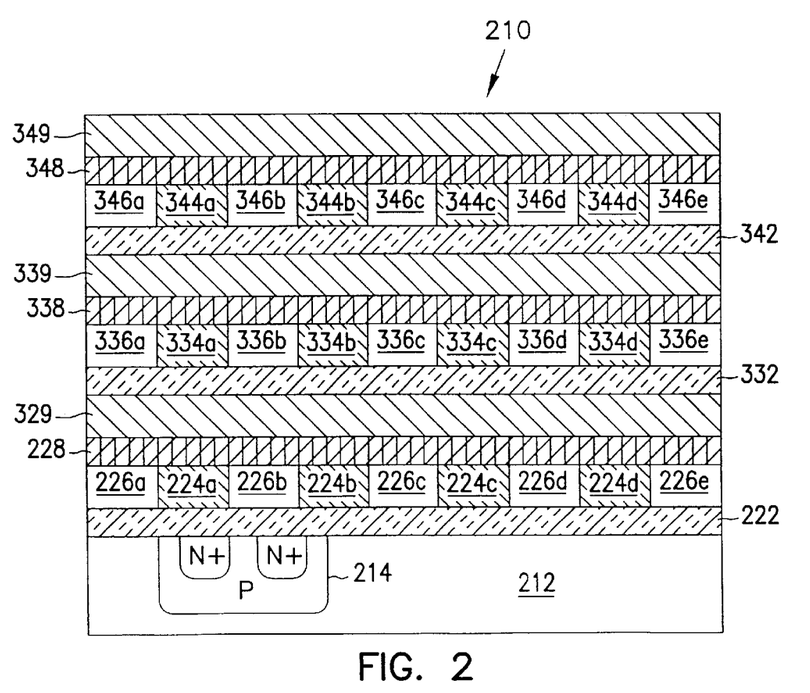
FIG. 2 is a cross section representation of a three-dimensional ferroelectric integrated memory device constructed in accordance with the present invention.

A three dimensional ferroelectric memory device is shown in cross section generally at 210 in FIG. 2. The device is formed on top of a semiconductor substrate 212 having circuitry formed therein as indicated at 214. In one embodiment circuitry 214 comprises access circuitry for accessing data stored in memory device 210. A first layer of the memory device is formed by depositing a an insulation layer 222 such as silicon dioxide on top of the active circuitry 214. This layer is grown by standard oxidation techniques and serves to insulate the active circuitry from the memory device. A plurality of bottom electrodes 224a, 224b, 224c, and 224d are formed as by standard sputtering and etching processes to form substantially parallel conducting lines formed with minimum line widths that are currently definable. The first layer bottom electrodes are formed of metal such as Platinum or other non-oxidizing conductive material and ion-etched to run in thin lines substantially parallel to each other and perpendicular to the page as shown. Only four lines are shown for clarity. Oxide, such as BPSG or $SiO_2$ is then deposited in a known manner and a chemical mechanical polish (CMP) or other means of generating a substantially flat surface is then performed. The CMP removes almost all oxide from the conductors to help prevent oxidation with the next layers to be formed. Oxidation of the conductors would reduce their conductivity and hence slow access to memory devices by increasing RC time constants. While conductors which oxidize to some extent will work, non-oxidizing conductor are preferred, and interact less with Oxygen contained in ferroelectric materials. The result is a very flat surface having strips of inter electrode insulation 226a, 226b, 226c, 226d, and 226e dispersed between the bottom electrodes. Next, a thin layer of ferroelectric material 228 is deposited over the flat surface. Any ferroelectric material may be used, including, but not limited to KNO3, $BaTiO_3$, TGS, PZT, $LiNbO_3$, and SbSI. The ferroelectric layer is deposited using many methods in various embodiments. Co/evaporation, D.C. sputtering, R.F diode sputtering, sol-gel methods, molecular beam epitaxy, spinning, laser evaporation, E-beam evaporation pyrolysis, metall.-organic deposition chemical vapor deposition, liquid phase epitaxy, and gas phase epitaxy are some of the alternative methods of forming the ferroelectric layer.

Next, a plurality of top electrodes 329, of which only one is observable in FIG. 2, are deposited on top of the ferroelectric material 228. Top electrodes 329 run perpendicular to the bottom electrodes 224a–d, and combined with the ferroelectric material between the intersections of the top and bottom electrodes comprise capacitors which form a memory cell. The dielectric of the capacitors is the ferroelectric material of the ferroelectric layer 228. The thickness of the ferroelectric layer is on the order of a few hundred angstroms to a few microns. The thickness of the conducting layers may be on the order of a few thousand angstroms. This comprises the first layer of memory cells.

The memory cells are addressed by one of the top electrodes and one of the bottom electrodes, which form bit and word or plate lines respectively. The cells operate because of the remnant electrical polarization of the ferroelectric material or domain between the overlapping conductors. By biasing the appropriate conducting lines, an electric field is generated within a memory cell. If the electric field is greater than the critical electric field needed to cause a charge displacement or electrical polarization of a memory cell, then the entire capacitor becomes polarized in one orientation (using the usual convention that the electric field lines point in the direction that a positive charge would move). If the electric field is reversed so that the electric field now exceeds the negative value of the critical electric field, the domain will reverse its orientation. These two orientations are used to represent the binary states of 1 and 0. The size of the electric fields are referred to as the coercive voltage. The amount of coercive voltage required to correctly orient the polarization of a cell is controlled by modifying the thickness of the cell, or by varying the ratio of the materials comprising the ferroelectric layer. A thicker cell requires a higher difference in voltage to coerce the polarization to the desired orientation. The ratio and type of materials is easily determined by one skilled in the art.

A second layer of memory cells starts with the formation of an insulative layer indicated at 332. This layer of memory cells is formed in the same manner as the first layer, with bottom electrodes 334a, 334b, 334c, 334d, and formation of inter electrode insulation 336a, 336b, 336c, 336d, and 336e dispersed between the bottom electrodes. This is again followed by a ferroelectric layer 338 and top electrodes 339.

A third layer of memory cells starts with the formation of an insulative layer indicated at 342. This layer of memory cells is formed in the same manner as the first layer, with bottom electrodes 344a, 344b, 344c, 344d, and formation of inter electrode insulation 346a, 346b, 346c, 346d, and 346e dispersed between the bottom electrodes. This is again followed by a ferroelectric layer 348 and top electrodes 349.

Figure 3:
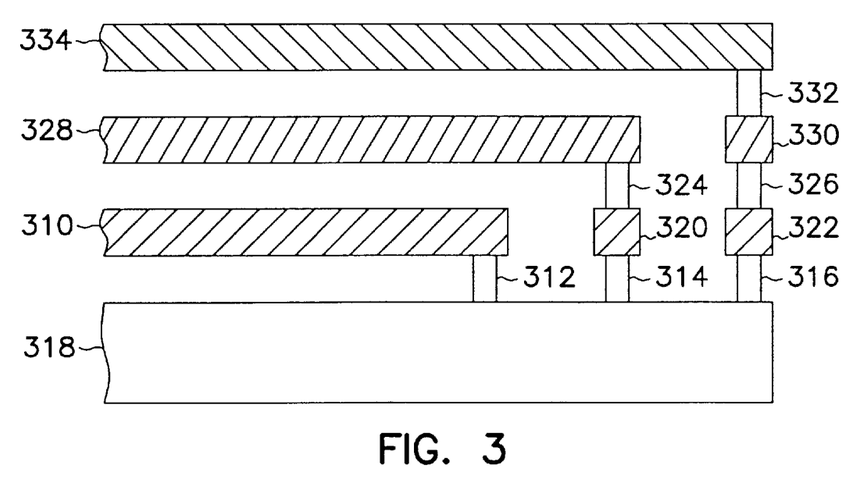
FIG. 3 is a cross section representation of multi layer contact is construction for the memory device of FIG. 2.

Only three layers are shown in FIG. 2, but it is clear that several more layers may be formed by continuing the process as many times as desired to form many memory cell layers, with each ferroelectric layer interleaved between successive layers of conducting lines. To contact the conductors on each of the levels, contacts are formed as shown in FIG. 3 for word or plate lines. The contacts are formed in staggered fashion, with the higher level contacts at the outside ends of the conductors formed through insulating layers to successive islands of lower level conductors to the substrate, wherein conductive lines are formed to cell sensing and selecting circuitry.

Three conductive layers are shown in FIG. 3. In one embodiment, prior to formation of a first conductive layer 310, a plurality of first level contacts 312, 314, 316 are formed through to a substrate 318 on which a memory device is formed as in FIG. 2. Only the conductive layers of the memory device are shown in FIG. 3 for clarity. The contacts are formed using standard metal via forming processes. Contact 312 is formed furthest from the edge of the memory device, and serves as the contact for accessing word or plate lines in the first layer of memory cells. The first layer 310 is then formed with islands 320 and 322 of laterally isolated conductive material being formed on top of conductors 314 and 316 respectively. The rest of the first layer of cells is then formed.

A pair of second level contacts 324 and 326 are then formed, contacting first level conductor islands 320 and 322. A second level conductor 328 is then formed, contacting contact 324 to provide a conductive path from the second level conductor to the substrate 318 A second level conductor island 330 is formed to contact 326 at the same time as the second level conductor 328 is formed The rest of the second layer of memory cells is then formed, with a third level contact 332 formed therethrough. Finally, a third level conductor 334 is formed contacting third level contact 332. Thus, a conductive path, comprising third level contact 332, second level island 330, second level contact 326, first level island 322 and first level contact 322 provide electrical connectivity to conductors formed on or in the substrate, and access to circuitry formed therein. In further embodiments, contacts may be formed on both ends of the word lines, alternating ends for successive layers. The bit lines are also similarly connected to the substrate and connect to sensing circuitry as shown later.

Figure 4:
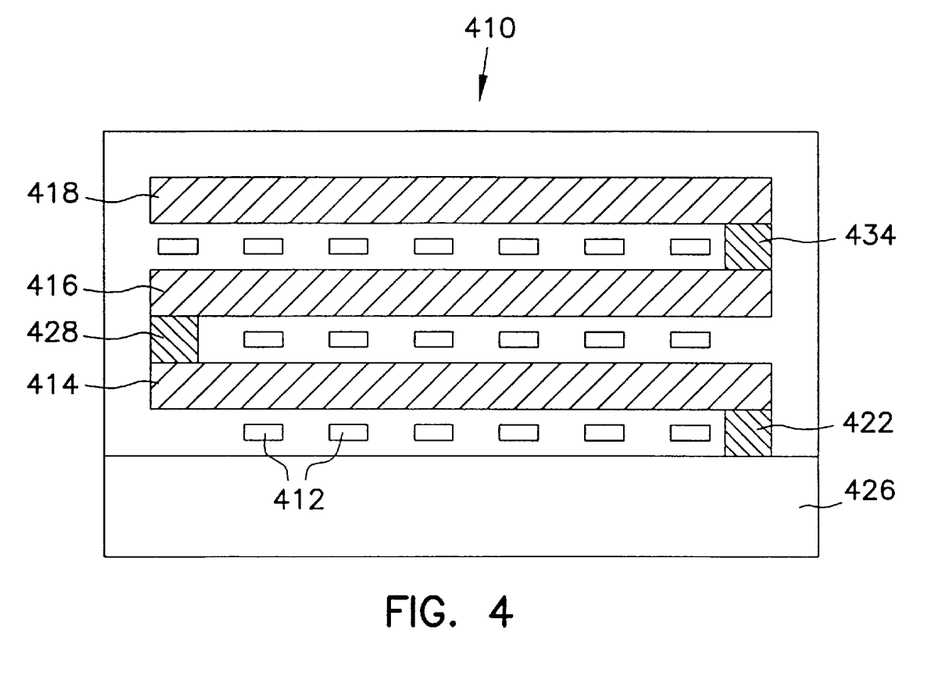
FIG. 4 is a cross section representation of an alternative three dimensional ferroelectric integrated memory device constructed in accordance with the present invention.

In a further embodiment, a continuous bit line is provided for a vertical plane of memory cells indicated generally at 410 as shown in FIG. 4. FIG. 4 is a cross section of a three dimensional ferroelectric memory device taken so that bit lines run parallel to the page. For clarity, only plate lines and bit lines are illustrated. The plate lines, such as those indicated at 412 run perpendicular to this particular view. Three layers are shown. Three corresponding bit lines 414, 416 and 418 run laterally to the view. A first contact is formed at 422 to connect the first level bit line 414 to a substrate 426 which contains further conductors and circuitry. The first level bit line 414 is coupled to the second level bit line 416 by a contact 428, and the third level bit line 418 is coupled to the second level bit line 416 by a contact 434. The contacts are formed in the same manner as in FIG. 3. Note however, that the bit lines for all three levels are coupled to each other. This provides for a less complicated interconnect structure. It also provides for the use of two capacitors for each cell. Note that the selection of any combination of bit and plate line result in bit line crossing the plate line twice, forming a capacitor at each intersection. This provides some redundancy, and increases the overall capacitance for each memory cell. This memory array lends itself to a common open bit line architecture. Switching the bit and plate lines would result in a memory array suitable for a folded bit line architecture.

Figure 5A:
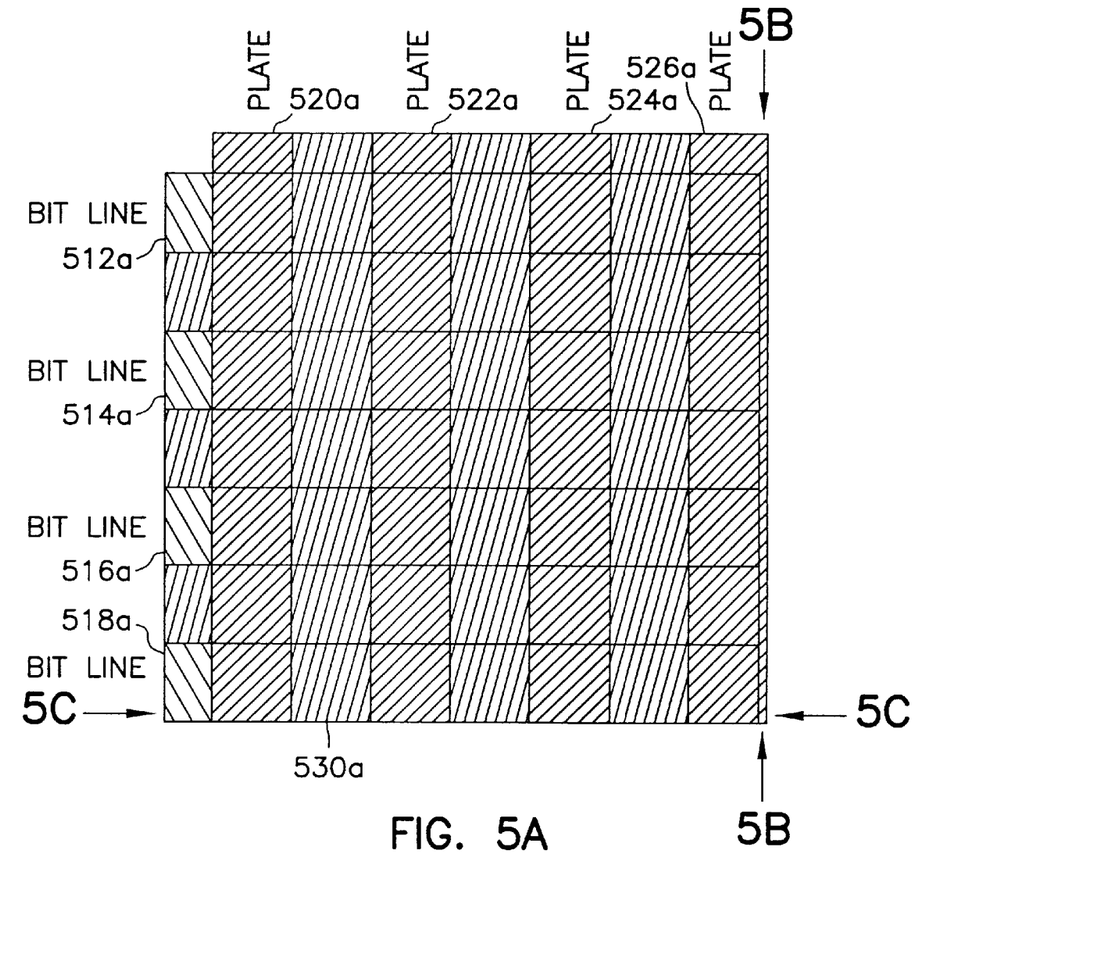
FIG. 5a is a planar view representation of a top level of an alternative three-dimensional ferroelectric integrated memory device constructed in accordance with the present invention.
Figure 5B:
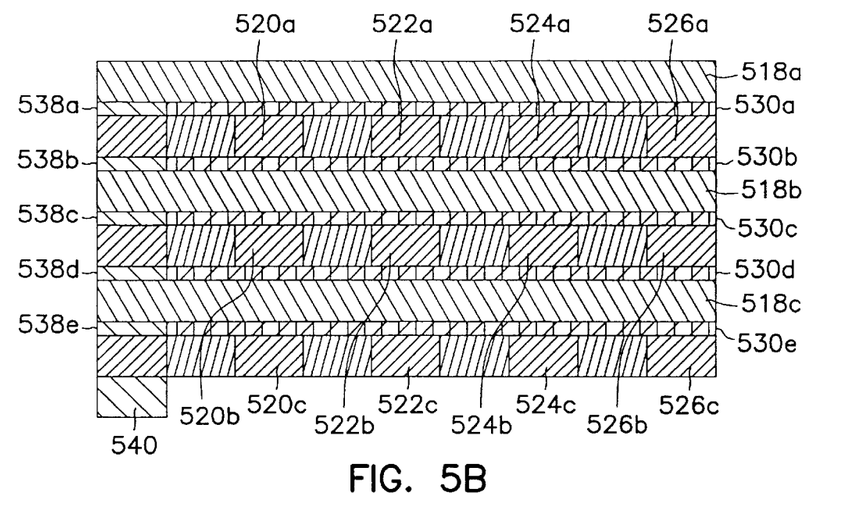
Figure 5C:
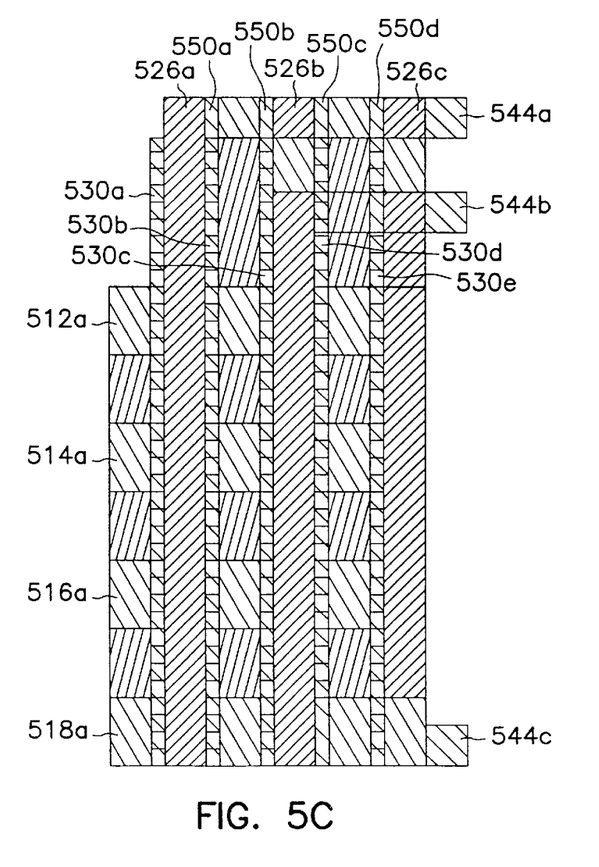

An alternative structure for a ferroelectric memory array is shown in FIGS. 5A, 5B and 5C. This alternative structure provides for an even higher density of memory array layers because it alternates between conductor layers and ferroelectric layers without the need for additional insulative layers. A plurality of bit lines 512*a–c*, 514*a–c*, 516*a–c*, and 518*a–c* intersect a plurality of perpendicular bit lines 520*a–c*, 522*a–c*, 524*a–c*, and 526*a–c* in multiple layers. Each bit line labeled with the same letter is coplanar, as is each plate line with the same letter. FIG. 5A shows a planar semi transparent view of the top layer. A plurality of ferroelectric material layers 530*a–e* are dispersed between alternating layers of conductors. In one embodiment, there are many more such layers and numbers of bit and plate lines. In FIG. 5B, bit lines 518*a*, 518*b* and 518*c* are coupled via a column of contacts 538*a*, 538*b*, 538*c*, 538*d*, and 538*e* through ferroelectric layers to a conductor 540 to form a single multi layer conductive bit line. Several contacts 544*a*, 544*b*, and 544*c* are shown in FIG. 5C coupling plate lines 526*a*, 526*b* and 526*c* respectively to provide for individual access to each of the plate lines. Contact 544*a* is coupled through an island in layer 526*c* and 526*b* and through a plurality of contacts 550*a*, 550*b*, 550*c*, and 550*d* through ferroelectric layers 530*b*, 530*c*, 530*d* and 530*e* respectively. Both the bit and plate contacts are formed in a manner similar to that shown in FIGS. 3 and 4 with islands in existing conductors, and contacts formed through nonconducting layers. In this embodiment, the plate line contacts for successive layers alternate from end to end of the array. In further embodiments, the position for each contact is selected as a function of desired layout for underlying circuitry. Note that side views are provided, and the contacts will be replicated for each set of bit lines and plate lines throughout the three dimensional memory array shown in FIG. 5A–C.

Figure 6:
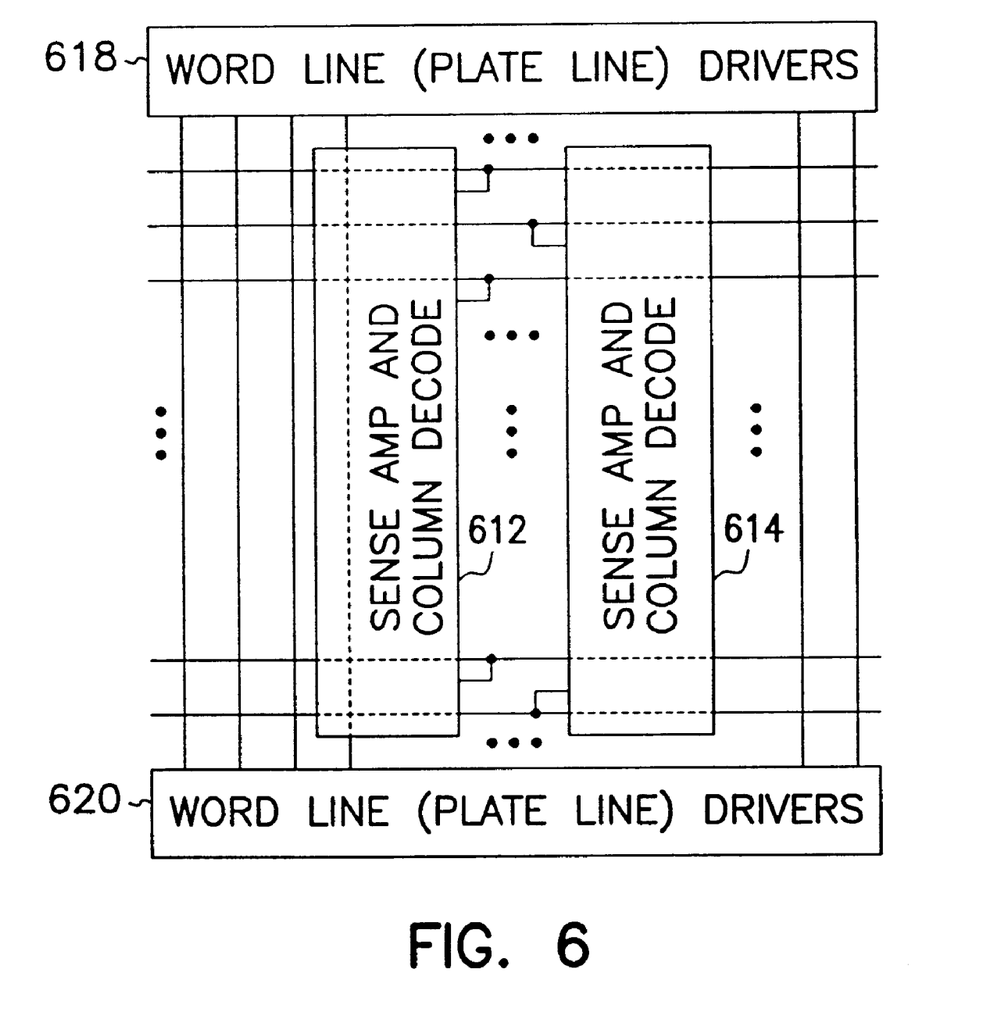
FIG. 6 is a planar view representation of a first level of the memory device of FIG. 2 having circuitry shown below the first level.

By building a three dimensional ferroelectric memory array on top of a semiconductor substrate, further devices may initially be formed in the substrate beneath where the memory device will be formed. As shown in FIG. 6, one embodiment of the invention comprises the use of sensing amplifiers shown in block form at 612 and 614 in the substrate beneath a first layer of memory cells. A plurality of bit lines are indicated as running across FIG. 6 with a plurality of word or plate lines shown running the length of FIG. 6. The multiple sets of three dots are used to indicate that there are more bit and plate lines than shown. Contacts are formed to the sense amplifiers as previously discussed with reference to FIGS. 3, 4 and 5. Plate line drivers 618 and 620 are shown on the outer edges of the first level of the memory array. The plate line drivers are also located beneath the memory array in a further embodiment. In yet a further embodiment, standard dynamic random access memory devices are constructed beneath the memory array.

In a further embodiment, two independently accessible memory arrays are provided side by side. Sense amplifier circuitry and decoding circuitry is provided in the substrate between and under the adjacent arrays. The arrays may be accessed in either a folded or an open bit line architecture as will be discussed below with reference to FIG. 9.

To access a memory cell, external address lines are decoded to identify which row of the memory array is to be accessed as described in U.S. patent application Ser. No. 08/520,256 entitled "Ferroelectric Memory Using Ferroelectric Reference Cells". This patent application is assigned to the same assignee as the present invention and is incorporated herein by reference. A plate line is then asserted, and all of the memory cells associated with that plate line, therefore, are coupled to one of the bit lines. If the memory cells were standard DRAM capacitors, the charge stored on the memory cell capacitors would be shared with the bit lines. Likewise, a ferroelectric memory cell having some non-remnant charge stored thereon will produce a small change to the bit line voltage. If the non-remnant component of the ferroelectric memory cell has been discharged, the bit line voltage will not change. As known to one skilled in the art, if the polarization of the ferroelectric dielectric is in one state and the plate line is pulsed high, the current through the memory cell will increase the voltage on the bit line to which it is coupled. If the polarization of the memory cell is in the opposite state, current through the memory cell is resisted and the voltage of the coupled bit line does not change.

Figure 7:
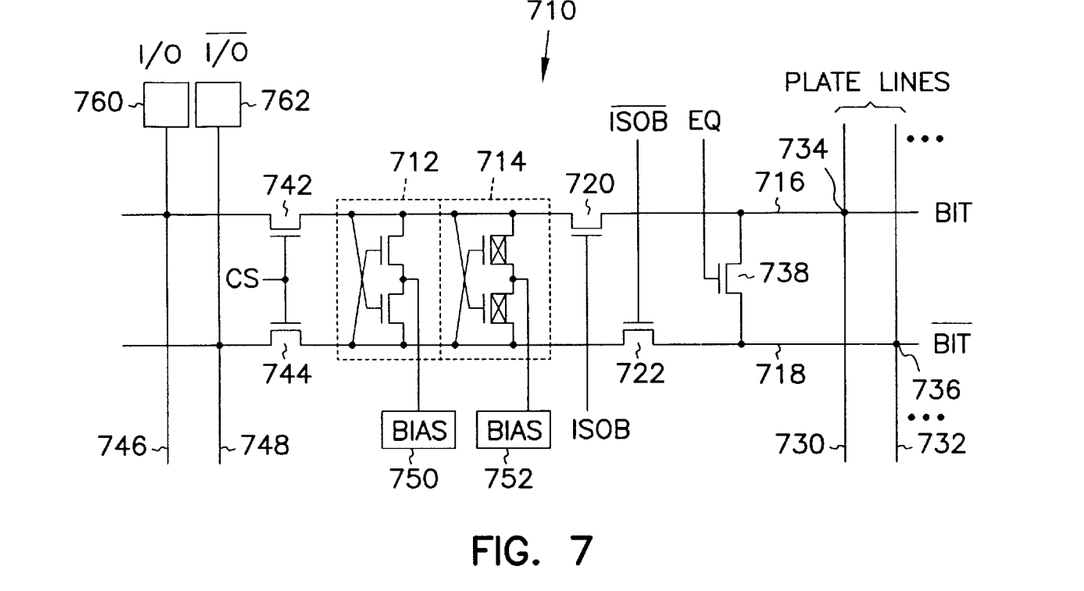
FIG. 7 is a simplified circuit diagram of the circuitry of FIG. 6.

The change in the voltage on the bit lines is sensed using a sense amplifier circuit as indicated generally at 710 in FIG. 7. The sense amplifiers are typically comprised of both an n-sense 712 and a p-sense 714 amplifier which detect the difference in the voltage on the bit lines as known to one skilled in the art. The sense amplifiers. are coupled to a first bit line 716 and a second bit line 718 through a pair of isolation transistors 720 and 722 respectively. The bit line pair cross a pair of plate lines 730 and 732 forming a pair of memory cells 734 and 736, one of which serves as a reference for the other and thus has an electric polarization opposite the other. The memory cells each comprise a bit line and word line, also referred to as a plate line, sandwiching ferroelectric material which acts as the dielectric of a capacitor. An equilibrate transistor 738 couples bit line 716 with bit line 736 under control of an EQ signal. Equilibrate transistor 738 has a source and drain coupled between the bit lines to ensure that the bit lines are of equal voltage following completion of a read and write cycle. Finally, a pair of column decoder transistors 742 and 744 selectively couple the bit lines under control of a column decode signal to a pair of I/O lines 746 and 748 for transmitting signals representative of the logical values stored in the memory cells.

Figure 8:
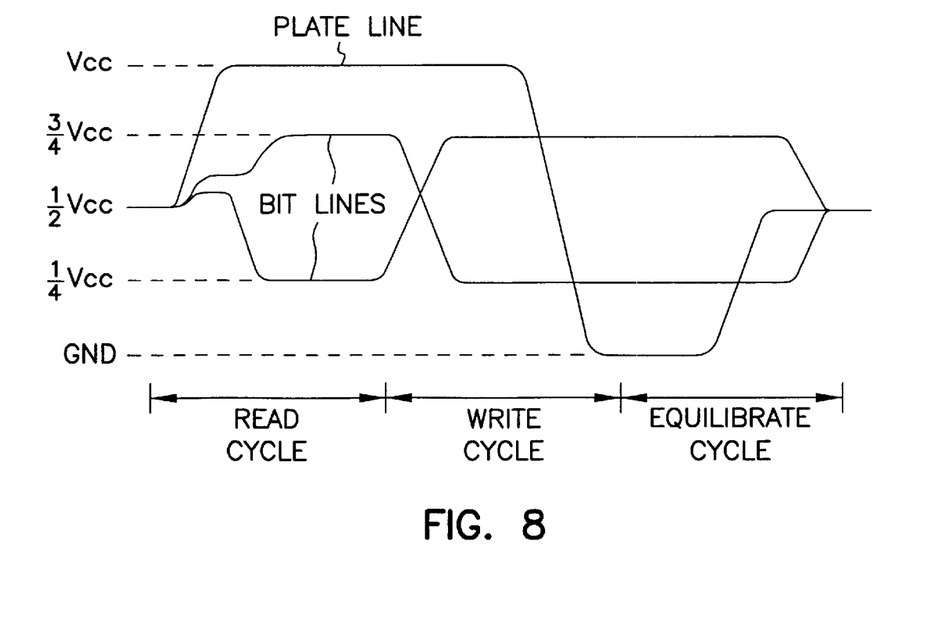
FIG. 8 is a timing diagram for the access circuitry of FIG. 7.

A timing diagram of the amplifier circuit is shown in FIG. 8. The bit line and plate line pairs are biased by well known external memory control biasing circuitry 750 and 752 to Vcc/2. When the plate line pair is clocked high and the isolation transistors turned on, the different polarizations of the memory cells 734 and 736 cause the bit lines to increase in voltage to different levels depending on the orientation of the magnetic charge of the cells as previously explained. The sense amplifiers drive the bit line pairs toward appropriate voltage rails due to the difference in voltage. That is, if the voltage of the bit line is higher than the reference voltage resulting from the reference cell, the bit line is driven toward the positive voltage rail. Conversely, if the bit line is lower than the voltage resulting from the reference cell, the bit line is driven toward ground. No separate access transistor for each cell is required, greatly reducing the amount of circuitry required for accessing the multi layer ferroelectric memory device.

By reading the memory cell, the state of the polarization may be reversed and thus the data which was stored on the cell will be reversed. That is, the polarization of the dielectric is such that a logical "one" provides a change in voltage of the digit line. To provide the requisite voltage change on the bit line, the polarization of the dielectric is changed. To read a logical one, therefore, the polarization of the memory cell is changed by reading the cell and then represents a logical "zero" after the cell has been read. If, on the other hand, the memory cell was storing a zero, there will be no voltage change on the bit line and the memory cell will remain polarized in a zero state. It can be seen that by merely reading a memory cell, the data will be lost if the 5 memory cell was storing a one. This is commonly referred to as a destructive read. A write-back operation is performed on the memory cell so that the polarization of the memory cell is returned to its pre-read state.

To write a one to the memory cell, the bit line coupled to the memory cell must be raised to approximately ¾ths of the positive voltage rail, while the plate line is at a low potential, near common. This is accomplished through the use of well known sense and write circuitry 760 and 762 coupled to the I/O lines 746 and 748. This reverses the polarization of the ferroelectric dielectric which resulted from pulsing the plate line high. The sense amplifiers are used to write-back a logical one to a memory cell from which a one was read. All of the sense amplifiers associated with a row of memory cells in the memory array are strobed at once. If the column address, therefore, is changed during the read operation, the data stored in any one of the memory cells of a row will not be lost. As seen in the timing diagram of FIG. 8, the bit line voltages are reversed at the beginning of the write cycle by the memory control sense and write circuitry 760 and 762 driving the I/O lines opposite the voltages they had during the read cycle. The plate lines are then driven low. This causes the cell having a 1 originally stored to be rewritten to a 1 because it's coercivity voltage has been exceeded. The cell having a 0 stays at 0.

Finally, an equilibrate cycle is performed by turning on the equilibrate transistor 738 which provides a current path between the bit line and plate line pairs, returning them to equal voltages, Vcc/2. The sense amplifier circuit 710 is then ready for the next access cycle.

Figure 9:
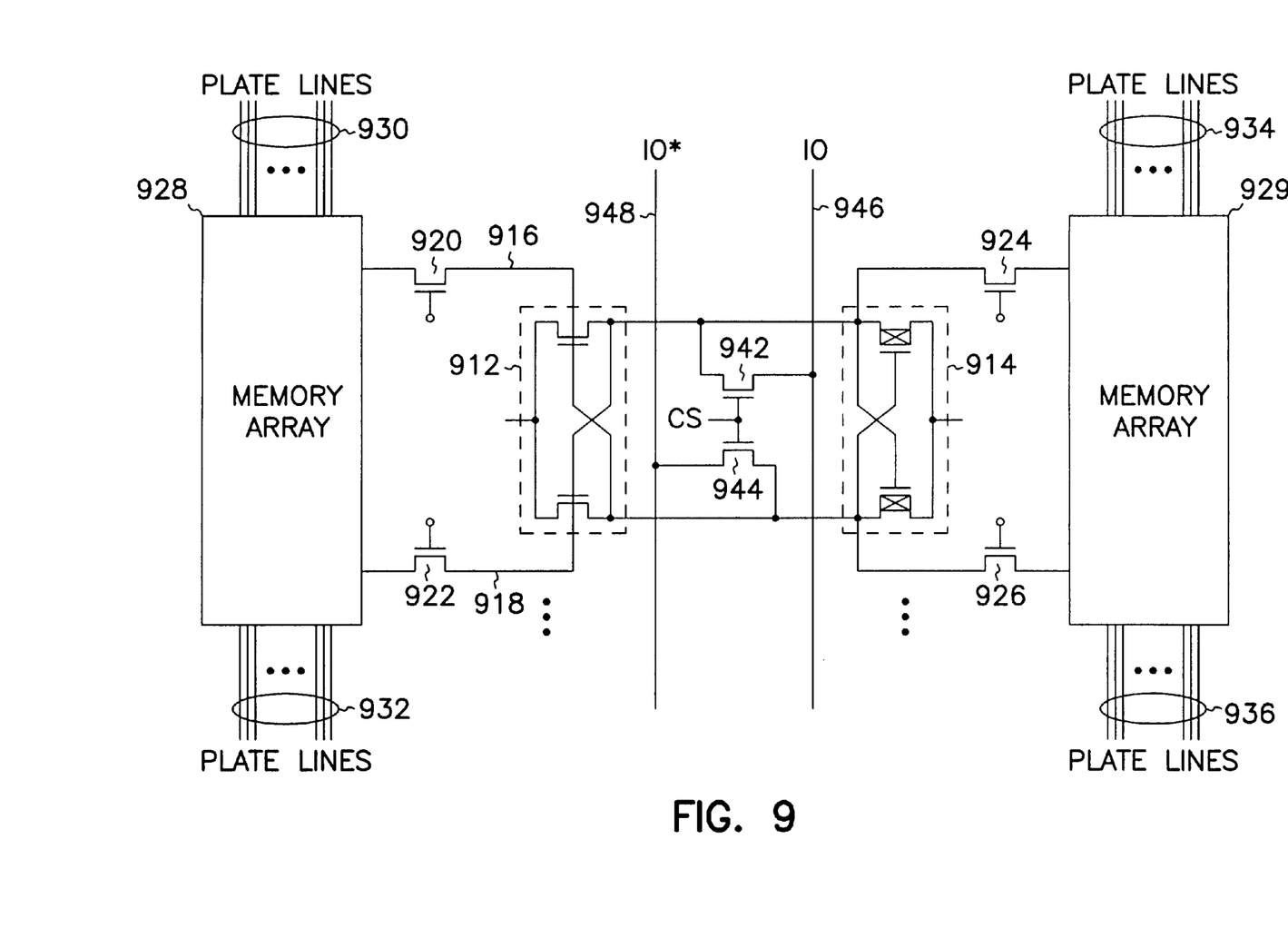
FIG. 9 is an alternative circuit for reading and writing ferroelectric memory devices.

An alternative sense amplifier circuit is indicated generally at 910 in FIG. 9. The sense amplifier circuit is typically comprised of both an n-sense 912 and a p-sense 914 amplifier which detect the difference in the voltage on bit lines as known to one skilled in the art. The sense amplifiers are coupled to a first bit line 916 and a second bit line 918 through two pair of isolation transistors 920 and 922, and 924 and 926. The pairs of isolation transistors couple the sense amplifier circuit to a pair of three dimensional ferroelectric memory cubes 928 and 929. Each cube is coupled to many sense amplifier circuits, and also are coupled to many plate lines as represented at 930, 932, 934 and 936. Each bit line pair cross a pair of plate lines forming pairs of memory cells, one of which serves as a reference for the other and thus has an electric polarization opposite the other. The memory cells each comprise a bit line and a plate line, sandwiching ferroelectric material which acts as the dielectric of a capacitor. Equilibrate transistors are not shown. A pair of column decoder transistors 942 and 944 selectively couple the bit lines under control of a column decode signal to a pair of I/O lines 946 and 948 for transmitting signals representative of the logical values stored in the memory cells.

In one embodiment of this sense amplifier, open bit line sensing is performed by enabling isolation transistors 920 and 924, or 922 and 926 so that each separate cube 930 and 934 respectively provide data from a memory cell in each array. For operation as a folded bit line architecture, isolation transistors 920 and 922, or 924 and 926 are enabled so that two memory cells from one cube array are accessed. In the folded bit line architecture, care is taken to ensure that nearby conductors in the same plane of capacitors are not selected at the same time to avoid potential cross talk problems. Vertically separated memory cells provide less chance of cross talk.

It should be noted that in semiconductor technologies, many times certain areas of the semiconductor die described as having a particular doping, could quite easily be of a different doping, promoting a different type of charge carrier. In such instances, if one were to reverse the primary carriers in all areas of the die and adjust for carrier mobility, the invention would operate in the same manner as described herein without departing from the scope and spirit of the present invention.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A three dimensional ferroelectric memory device formed on a substrate comprising:

a first layer of bottom conductors;

a first bottom insulative layer extending substantially only between the conductors of the first layer of bottom conductors;

a first ferroelectric layer formed on top of the first bottom insulative layer and first layer of bottom conductors; and a first layer of top conductors formed on top of the first ferroelectric layer to form a first layer of ferroelectric memory cells where the conductors of the first layer of top conductors overlap the conductors of the first layer of bottom conductors.

2. The three dimensional ferroelectric memory device of claim 1 wherein the first layer of bottom conductors and the first bottom insulative layer are polished substantially flat.

3. The three dimensional ferroelectric memory device of claim 1 and further comprising a first isolating layer beneath the first layer of bottom conductors.

4. The three dimensional ferroelectric memory device of claim 1 and further comprising:

a first top insulative layer extending substantially only between conductors of the first layer of top conductors.

5. The three dimensional ferroelectric memory device of claim 4 and further comprising:

a second ferroelectric layer formed on top of said first top insulative layer and first layer of top conductors; and a second layer of top conductors formed on top of the second ferroelectric layer to form a second layer of ferroelectric memory cells where the conductors of the second layer of top conductors overlap the conductors of the first layer of top conductors.

6. The three dimensional ferroelectric memory device of claim 5 and further comprising a second top insulative layer formed between the conductors of the second layer of top conductors.

7. The three dimensional ferroelectric memory device of claim 6 and further comprising a plurality of further layers of ferroelectric layers and insulated conductors to form a plurality of further layers of ferroelectric memory cells.

8. The three dimensional ferroelectric memory device of claim 4 and further comprising:
   a second isolating layer on top of the first layer of top conductors,
   a second layer of bottom electrodes formed on top of the second isolating layer;
   a second bottom insulative layer extending substantially only between the conductors of said second layer of bottom conductors;
   a second ferroelectric layer formed on top of the second bottom insulative layer and second layer of bottom conductors; and
   a second layer of top conductors formed on top of the second ferroelectric layer to form a second layer of ferroelectric memory cells where the conductors of the second layer of top conductors overlap the conductors of the second layer of bottom conductors.

9. The three dimensional ferroelectric memory device of claim 8 and further comprising a plurality of further layers of isolating layers, conductive layers and insulative layers forming a plurality of further layers of ferroelectric memory cells.

10. A three dimensional ferroelectric memory device formed on a semiconductor substrate comprising:
    a first substantially flat layer of bottom conductors;
    a substantially flat insulative layer extending only between the conductors of the first layer of bottom conductors;
    a first ferroelectric layer formed on top of the first layer of bottom conductors;
    a first layer of top conductors formed on top of the first ferroelectric layer to form a first layer of ferroelectric memory cells wherein the conductors of the first layer of top conductors overlap the conductors of the first layer of bottom conductors; and
    circuitry formed in the substrate beneath the layers of conductors and ferroelectric.

11. The three dimensional ferroelectric memory device of claim 10 wherein the circuitry comprises ferroelectric memory cell sensing circuitry coupled to the ferroelectric memory cells.

12. The three dimensional ferroelectric memory device of claim 10 wherein the conductors are formed of non-oxidizing conductive material.

13. The three dimensional ferroelectric memory device of claim 10 wherein the circuitry comprises a dynamic random access memory device.

14. The three dimensional ferroelectric memory device of claim 10 wherein the circuitry comprises sensing circuitry for the ferroelectric memory cells.

15. A three dimensional multi layer ferroelectric memory device formed on a semiconductor substrate having electrical contact with access circuitry formed in the substrate, comprising:
    a first layer of bottom conductors having insulator formed only between the bottom conductors and having first bottom conductive layer islands of conductive material formed therein to provide a vertically conductive path to the access circuitry;
    a first ferroelectric layer formed on top of said first layer of bottom conductors having conductive vias formed therein corresponding to the first bottom conductive layer islands of conductive material; and
    a first layer of top conductors formed on top of the first ferroelectric layer to form a first layer of ferroelectric memory cells wherein the conductors of the first layer of top conductors overlap the conductors of the first layer of bottom conductors, and also having first top conductive layer islands of conductive material formed therein to provide a vertically conductive path and wherein each conductor is coupled to a conductive via in the first ferroelectric layer to provide a contact to the access circuitry for accessing the ferroelectric memory cells.

16. The three dimensional multi layer ferroelectric memory device of claim 15 and further comprising successive layers of similarly formed memory cells, wherein each conductive layer is coupled through conductive vias to lower level conductive islands to provide electrical connection to the memory access circuitry in the substrate.

17. A three dimensional multi layer ferroelectric memory device formed on a semiconductor substrate having electrical contact with access circuitry formed in the substrate, comprising:
    a first layer of bottom conductors electrically coupled to the access circuitry formed in the substrate, said bottom conductors having an insulative material formed substantially only between the bottom conductors;
    a first ferroelectric layer formed on top of said first layer of bottom conductors having conductive vias formed therein electrically coupled to the first layer of bottom conductors;
    a first layer of top conductors formed on top of the first ferroelectric layer to form a first layer of ferroelectric memory cells where the conductors of the first layer of top conductors overlap the conductors of the first layer of bottom conductors; and
    a plurality of further similarly formed layers of ferroelectric memory cells wherein the bottom conductors of such layers are electrically coupled to each lower layer of bottom conductors forming a plurality of three dimensional continuous conductors to provide a contact to the access circuitry for accessing the ferroelectric memory cells.

18. The three dimensional multi layer ferroelectric memory device of claim 17 wherein each continuous conductor comprises a plate line.

19. The three dimensional multi layer ferroelectric memory device of claim 17 wherein each continuous conductor comprises a bit line.

20. A three dimensional ferroelectric memory comprising a pair of cubes formed on a semiconductor substrate, each cube comprising:
    a first substantially flat layer of bottom conductors having insulative material formed substantially only between the bottom conductors;
    a first ferroelectric layer formed on top of the first layer of bottom conductors;
    a first layer of top conductors formed on top of the first ferroelectric layer to form a first layer of ferroelectric memory cells wherein the conductors of the first layer of top conductors overlap the conductors of the first layer of bottom conductors; and sensing circuitry formed in the substrate beneath the layers of conductors and ferroelectric for accessing both cubes.

21. The three dimensional ferroelectric memory of claim 20 wherein the sensing circuitry accesses each cube in an open bit line manner.

22. The three dimensional ferroelectric memory of claim 20 wherein the sensing circuitry accesses each cube in a folded bit line manner.

23. A memory device formed on a substrate comprising:

a first layer of bottom conductors;

a first bottom insulative layer extending only between the conductors of the first layer of bottom conductors;

a first ferroelectric layer formed on top of the first bottom insulative layer and first layer of bottom conductors;

a first layer of top conductors formed on top of the first ferroelectric layer forming a first layer of ferroelectric memory cells where the conductors of the first layer of top conductors overlap the conductors of the first layer of bottom conductors; and a plurality of further layers of ferroelectric memory cells formed in the same manner successively on top of the first layer of ferroelectric memory cells.

24. The memory device of claim 23 and further comprising insulating layers formed between each layer of ferroelectric memory cells.

25. A three dimensional ferroelectric memory device formed on a substrate comprising:

a first layer of bottom conductors formed on the substrate:

a first bottom insulative layer extending only between the conductors of the first layer of bottom conductors;

a first ferroelectric layer formed on top of the first bottom insulative layer and first layer of bottom conductors; and a first layer of top conductors formed on top of the first ferroelectric layer to form a first layer of ferroelectric memory cells where the conductors of the first layer of top conductors overlap the conductors of the first layer of bottom conductors.

26. The three dimensional ferroelectric memory device of claim 25 and further comprising:

a first top insulative layer extending only between conductors of the first layer of top conductors.

27. The three dimensional ferroelectric memory device of claim 26 and further comprising:

a second ferroelectric layer formed on top of said first top insulative layer and first layer of top conductors: and a second layer of top conductors formed on top of the second ferroelectric layer to form a second layer of ferroelectric memory cells where the conductors of the second layer of top conductors overlap the conductors of the first layer of top conductors.

28. The three dimensional ferroelectric memory device of claim 27 and further comprising a second top insulative layer formed only between the conductors of the second layer of top conductors.

29. The three dimensional ferroelectric memory device of claim 6 and further comprising a plurality of further layers of ferroelectric layers and conductors having insulative layers extending only between the conductors to form a plurality of further layers of ferroelectric memory cells.

30. A three dimensional multi layer ferroelectric memory device formed on a semiconductor substrate having electrical contact with access circuitry formed in the substrate, comprising:

a first layer of bottom conductors electrically coupled to the access circuitry formed in the substrate, said bottom conductors having an insulative material formed only between the bottom conductors;

a first ferroelectric layer formed on top of said first layer of bottom conductors and insulative material, the first ferroelectric layer having conductive vias formed therein electrically coupled to the first layer of bottom conductors;

a first layer of top conductors formed on top of the first ferroelectric layer to form a first layer of ferroelectric memory cells where the conductors of the first layer of top conductors overlap the conductors of the first layer of bottom conductors; and a plurality of further similarly formed layers of ferroelectric memory cells wherein the bottom conductors of such layers are electrically coupled to each lower layer of bottom conductors forming a plurality of three dimensional continuous conductors to provide a contact to the access circuitry for accessing the ferroelectric memory cells.

* * * * *